US 6,667,668 B1

(12) United States Patent
Henrion

(10) Patent No.: US 6,667,668 B1
(45) Date of Patent: Dec. 23, 2003

(54) SYSTEM AND METHOD FOR CONTROLLING THE FREQUENCY OUTPUT FROM AN OSCILLATOR USING AN IN-PHASE VOLTAGE

(75) Inventor: W. S. Henrion, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 19 days.

(21) Appl. No.: 10/042,782

(22) Filed: Jan. 9, 2002

(51) Int. Cl.⁷ ................................................. H03C 1/00
(52) U.S. Cl. ..................................... 332/149; 331/117 R
(58) Field of Search ............................. 331/117 R, 153, 331/172, 177 R, 57; 332/149

(56) References Cited

U.S. PATENT DOCUMENTS

| 5,075,643 | A | * | 12/1991 | Einbinder .................... 332/135 |
| 5,856,753 | A | | 1/1999 | Xu et al. |
| 6,067,307 | A | | 5/2000 | Krishnamoorthy |
| 6,150,893 | A | * | 11/2000 | Fattaruso ................. 331/117 R |
| 6,198,360 | B1 | | 3/2001 | Henrion |
| 6,215,367 | B1 | * | 4/2001 | Blaud et al. ................. 331/105 |
| 6,268,778 | B1 | * | 7/2001 | Mucke et al. ........... 331/117 R |
| 6,272,160 | B1 | | 8/2001 | Stronczer |

OTHER PUBLICATIONS

Savoj et al., "A 10Gb/s CMOS Clock and Data Recovery Circuit with Frequency Detection," 2001 International Solid-State Circuits Conference, 4 pgs.

* cited by examiner

Primary Examiner—Henry Choe
(74) Attorney, Agent, or Firm—Kevin J. Daffer; Conley Rose P.C.

(57) ABSTRACT

A circuit, method, and network are disclosed herein to implement a voltage-controlled LC oscillator. The oscillator is configured having an LC tank circuit which is modulated by an in-phase modulating voltage. The modulating voltage can have a phase angle and amplitude that is controlled. Depending on the values of those control signals, the oscillating voltage will either increase or decrease current within the LC tank circuit and, thereby, increase or decrease the oscillating voltage respectively. Any number of phases can be connected together to produce signals of dissimilar phase angles. Preferably, those signals have phase angles of 0°, 180°, or even fractions thereof if an external circuitry is applied to the oscillation network.

17 Claims, 4 Drawing Sheets

SYSTEM AND METHOD FOR CONTROLLING THE FREQUENCY OUTPUT FROM AN OSCILLATOR USING AN IN-PHASE VOLTAGE

BACKGROUND OF THE INVENTION

1. Field of the Invention

This invention relates to an electronic oscillators and, more particularly, to an inductor-capacitor ("LC") oscillator or resistor-capacitor ("RC") ring oscillator having a resonant frequency that is controlled by an in-phase voltage.

2. Description of the Related Art

The following descriptions and examples are not admitted to be prior art by virtue of their inclusion within this section.

Within nearly every electronic subsystem that relies on sequential operations, it is essential to have an oscillator or waveform generator of some sort. The oscillator functions to produce a periodic waveform that is then used to initiate measurements or processes within an electronic subsystem. For example, oscillators are used in any digital or analog electronic circuitry, such as a receiver, transmitter, computer, computer peripheral, and a host of other devices too numerous to mention.

There are many types of oscillators. For example, a simple form of oscillator can be made by charging a capacitor through a resistor (or a current source), then discharging it rapidly when the voltage reaches some threshold, beginning the cycle anew. This form of oscillator is oftentimes known as a relaxation oscillator or RC oscillator. Although simplistic in design, an RC oscillator is sometimes inaccurate or unstable at high frequencies. It is generally understood that crystal oscillators are the most stable and accurate oscillators at high frequencies. Using quartz as a piezoelectric, a crystal oscillator is driven by an applied electric field which, in turn, generates a voltage at the surface of the crystal. The effect is to produce a rapidly changing reactance with frequency. The quartz crystal can, however, be rather expensive and, although stable, oftentimes requires a different quartz crystal each time a different frequency is required.

An LC oscillator is generally regarded to be more accurate and stable at high frequencies then an RC oscillator, yet less expensive to implement and to modulate than crystal oscillators. The tuned LC component of the oscillator is connected to an amplifier which provides gain at the resonant frequency of the LC components. Overall positive feedback is then used to cause a sustained oscillation in the LC components of the oscillator, alternatively known as the "LC tank circuit." As with a crystal oscillator, an LC oscillator can sustain its resonant oscillation using the gain of an amplifier, for example, yet the frequency output of the LC tank can be more readily adjusted.

One mechanism for adjusting the frequency of an LC oscillator is to adjust the capacitor or inductor components. Frequency modulation can, therefore, be performed by changing the inductance or capacitance values in the tank circuit of the oscillator. While voltage-dependent inductors are uncommon, voltage-dependent capacitors are widely used in voltage controlled oscillators ("VCOs"). The most common form of a voltage-dependent capacitor is the varactor. While varactors are readily used to modulate the frequency output of an LC or ring oscillator, it is oftentimes difficult to target the exact capacitance value needed to achieve a targeted frequency output. In many instances, parasitic capacitance is associated with the trace conductors attached to each terminal of the capacitor and, therefore, any change to the variable capacitor (varactor) may not account for the parasitic capacitance on the trace conductive lines. The parasitic capacitors add to the total capacitance which, in effect, reduce the percentage variation achievable with the varactor. Laser trimming can be used to further tweek the varactor value, however, laser trimming is costly and impractical as a high throughput manufacturing fix.

It would be desirable to implement an oscillator using, for example, LC components, yet also being able to adjust the frequency output of the oscillator without having to change the capacitive or inductive values of the LC tank circuit. The desired LC oscillator should also be capable of use as a multi-phase oscillator.

SUMMARY OF THE INVENTION

The problems outlined above are in large part solved by a circuit and method disclosed herein. The circuit includes an oscillator and, preferably, an LC oscillator or an RC ring oscillator. The oscillator can generate a single-ended output or a differential pair of outputs. If a differential pair of oscillating outputs are generated, the pair of outputs are cyclical waveforms that are a pair of sine waves which are 180° out of phase with respect to one another. Yet each of the sine waves are modulated by voltages that are at the same phase angle as the oscillator outputs, or offset by 180° from the oscillator outputs.

The oscillator frequency within the circuit are regulated by what is hereinafter known as an "in-phase voltage." The in-phase voltage is of the same phase angle as the oscillating frequency being modulated. If oscillation frequency is to be regulated downward, then the in-phase modulating voltage has a sign of the phase angle that causes the oscillating frequency to decrease. Conversely, if the oscillating frequency is to be increased, then the in-phase modulating voltage has a phase with the opposite sign. Thus, the definition "in-phase" refers to either the same phase angle or 180° phase angle difference between the modulating voltage waveform and the oscillator output voltage waveform. Using the word "sign" rather than "phase," it is noted that all phases other than 0° or 180° are excluded. Importantly, however, in-phase does not refer to a 90° out of phase relationship, as in quadrature voltages or quadrature currents. By making the modulated voltage the same phase (i.e., in-phase) as the voltage being placed on the inductor or capacitor of the LC tank circuit, modulation can increase or decrease the oscillating frequency while using less circuitry compared to quadrature current modulation of the frequency. A frequency modulated oscillator can, therefore, be achieved with less complexity yet retaining the stability of LC or RC ring oscillators.

According to one embodiment, a circuit is provided. The circuit includes an oscillator having a capacitor. The circuit also includes a modulator adapted to change a resonant frequency of the oscillator by selectively coupling a modulating voltage upon the oscillator that is in-phase with a voltage placed upon the capacitor. If the resonant frequency is to increase or decrease, the modulating voltage must either by at the same phase angle or offset by 180° relative to the oscillating voltage placed on the capacitor.

In addition to the modulator producing an in-phase modulating voltage, the modulator can also produce a modulating voltage which is amplitude regulated. The amount by which the amplitude of the modulating voltage changes will have a direct bearing on the amount by which the oscillator increases or decreases in frequency.

According to yet another embodiment, a multi-phase oscillator is provided. The oscillator includes a plurality of stages coupled in series, where each stage has a corresponding stage whose output is substantially 180° out of phase from one of the other stages. In this fashion, multiple stages can be linked together and controlled by a plurality of modulators. The modulators can change the frequency of the oscillator stages by coupling a modulating voltage upon each of the plurality of stages that is in-phase with a voltage placed on an inductor and/or capacitor attributed to that stage. In other words, a modulating voltage is sent to each of the plurality of stages. That modulating voltage has its magnitude and sign modulated by a control voltage.

According to yet another embodiment, a method is provided. The method is used to control a resonant frequency by changing a control signal voltage value to cause a corresponding change in the magnitude and sign of the in phase modulating voltage. The modulating voltage is then inserted in series with an inductor and/or capacitor of an oscillator to change the oscillation frequency of the oscillator dependent on the amount of change in the amplitude and sign (i.e., 0° being considered plus and 180° being considered minus).

BRIEF DESCRIPTION OF THE DRAWINGS

Other objects and advantages of the invention will become apparent upon reading the following detailed description and upon reference to the accompanying drawings in which.

Figure 1:
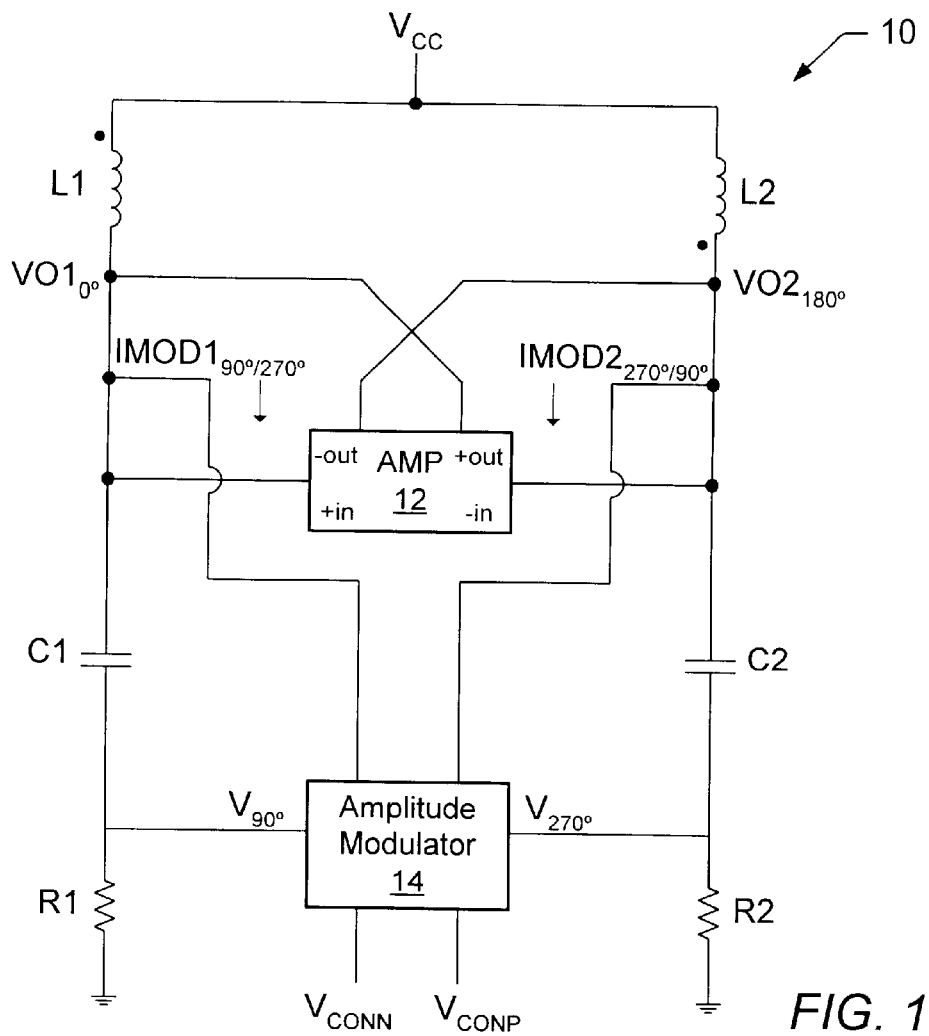
FIG. 1 is a block diagram of an LC oscillator, an amplifier, and an amplitude modulator, wherein the modulator produces a quadrature current output being fed into the LC oscillator to modulate the frequency of the oscillator.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a pair of LC tank circuits that comprise conductor L1, capacitor C1, inductor L2, and capacitor C2. On the node which separates the inductors and capacitors within each respective tank circuit is a pair of oscillator output voltages, noted as VO1 and V02, respectively. The output voltages oscillate at 180° phase offset from one another. For sake of reference, the output voltage of the first tank circuit oscillates at a 0° phase angle, and is noted as $VO1_{0°}$ while the output of the second tank circuit oscillates at a 180° phase angle, and is noted as $VO2_{180°}$.

According to one example, the frequency of the output voltages VO1 and V02 can be controlled by a quadrature current. The modulating, quadrature current is noted as IMOD1 and IMOD2, respectively. An amplifier 12 puts gain into the oscillating output voltage to maintain its oscillation. Modulator 14 produces a modulating current as quadrature current (i.e., +/−90° phase offset from the voltage across the respective tuned LC tank circuit, e.g., VO1 and V02). Therefore, the oscillating voltage is extracted and, when coupled through respective capacitors C1 and C2, the other terminal of those capacitors will produce a near 90° phase offset from the respective VO1 and V02 phase values. That phase offset will be fed as a voltage $V_{90°}$ and $V_{270°}$ into modulator 14. Depending on the value of the control signals $V_{CONN}$ and $V_{CONP}$, either $IMOD1_{90°}$ or $IMOD1_{270°}$ will be placed on the oscillator which produces $VO1_{0°}$ and either $IMOD2_{270°}$ or $IMOD2_{90°}$ will be placed on the oscillator which produces $VO2_{180°}$. Modulator 14, thereby, produces a modulating current which has either an advanced or retarded phase angle relative to the oscillating voltage of the respective oscillator.

Figure 2:
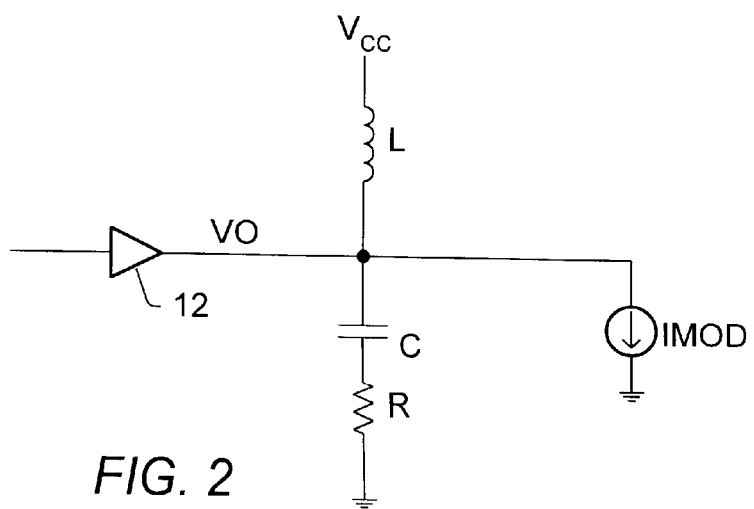
FIG. 2 is a circuit diagram of the LC oscillator of FIG. 1, showing the resonant frequency of the oscillator controllable by the quadrature current.

Given that the modulating currents are +/−90° offset from the oscillating voltages being modulated, the circuit scheme 10 shown in FIG. 1 can be referred to as a quadrature current modulated oscillation circuit. Whether the modulating current is advanced or retarded 90° from the oscillation voltage depends on whether the control signals dictate that the oscillation frequency output from the oscillators are to increase or decrease. The above modulation technique is only one example by which an oscillator frequency can change using quadrature currents. Details of a similar form of quadrature current frequency modulation is set forth in U.S. Pat. No. 6,198,360 herein incorporated by reference. FIG. 2 illustrates the modulation mechanism of FIG. 1, for example.

Figure 3:
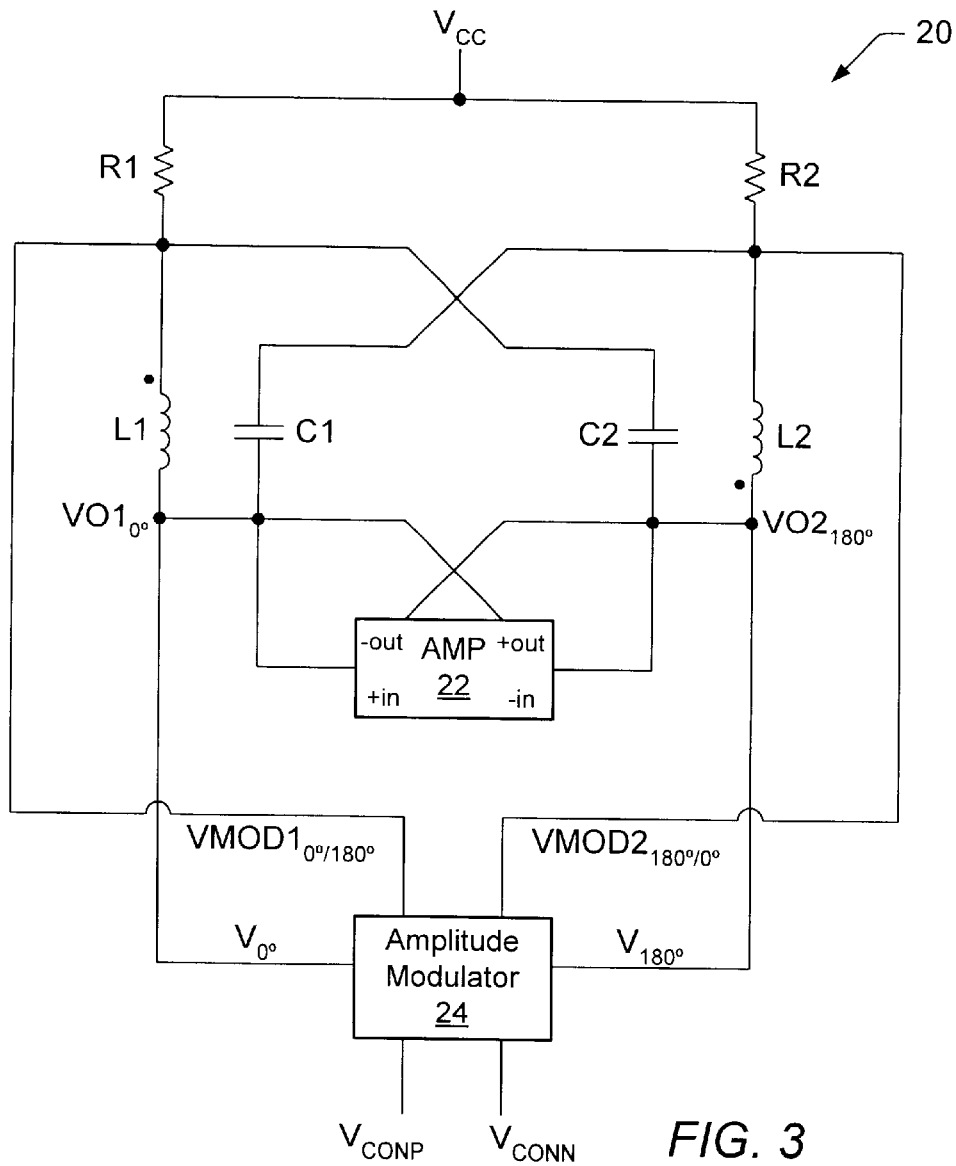
FIG. 3 is a block diagram of an LC oscillator, an amplifier, and an amplitude modulator, wherein the modulator produces an in-phase voltage being fed in series with the inductor and capacitor to modulate the frequency of the oscillator.

FIG. 3 illustrates circuit 20, according to another embodiment. Circuit 20 avoids the added complexity of circuit 10. Instead of using quadrature currents to modulate oscillating frequency, circuit 20 simply uses in-phase voltages. Importantly, quadrature voltages need not be derived and ensuing quadrature currents are not used. The in-phase voltages produced from modulator 24 and resistor R1 and R2 are at the same phase angle as the oscillating voltages, or 180° offset from the oscillating voltages. Amplifier 22 simply puts gain into the overall oscillation circuit 20. The gain is greater than or equal to 1 and the phase shift produced by amplifier 22 is 360°. A 360° phase shift will ensure oscillation continues at the output of amplifier 22 (i.e., at the input of the LC tank circuit).

Similar to FIG. 1, circuit 20 includes a pair of LC tank circuits L1, C1 and L2, C2. Inductors L1 and L2 are mutually coupled with a coupling coefficient k. Resistors R1 and R2 are placed in series with inductors L1 and L2. Preferably, resistor R1 value is substantially the same as resistor R2 value, capacitor C1 value is substantially the same as capacitor C2 value, and inductor L1 value substantially is the same as inductor L2 value.

Instead of forwarding a quadrature voltage into modulator 24, an in-phase voltage is placed into modulator 24 which then produces an in-phase output voltage being selected either at the same phase angle or 180° advanced to that of the oscillator voltage phase angle. The in-phase voltage then modulates the voltage across the corresponding inductor L1 and L2, and the corresponding capacitor C1 and C2.

Figure 4:
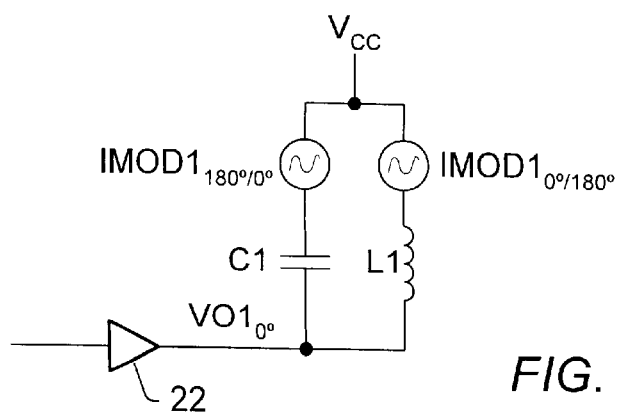
FIG. 4 is a circuit diagram of the LC oscillator of FIG. 3, showing the oscillating frequency of the oscillator controllable by the in-phase voltage linked in series with the inductor and capacitance of the LC oscillator.

FIG. 4 illustrates a single ended tank circuit and, more particularly, the left-hand side of the LC oscillator. As modulating voltage VMOD1 takes on a 0° phase angle from the modulator, then the amount of voltage difference between VMOD1 at the same phase angle as $VO1_{0°}$ is rather small. This leaves less voltage across inductor L1, causing less current within the LC tank circuit of inductor L1 and capacitor C1, thereby, lowering the frequency of oscillation. Amplifier 22 places gain into the oscillation circuit to maintain the decreased frequency therein. However, if VMOD1 takes on a 180° phase angle, then the opposite result will occur.

Figure 5:
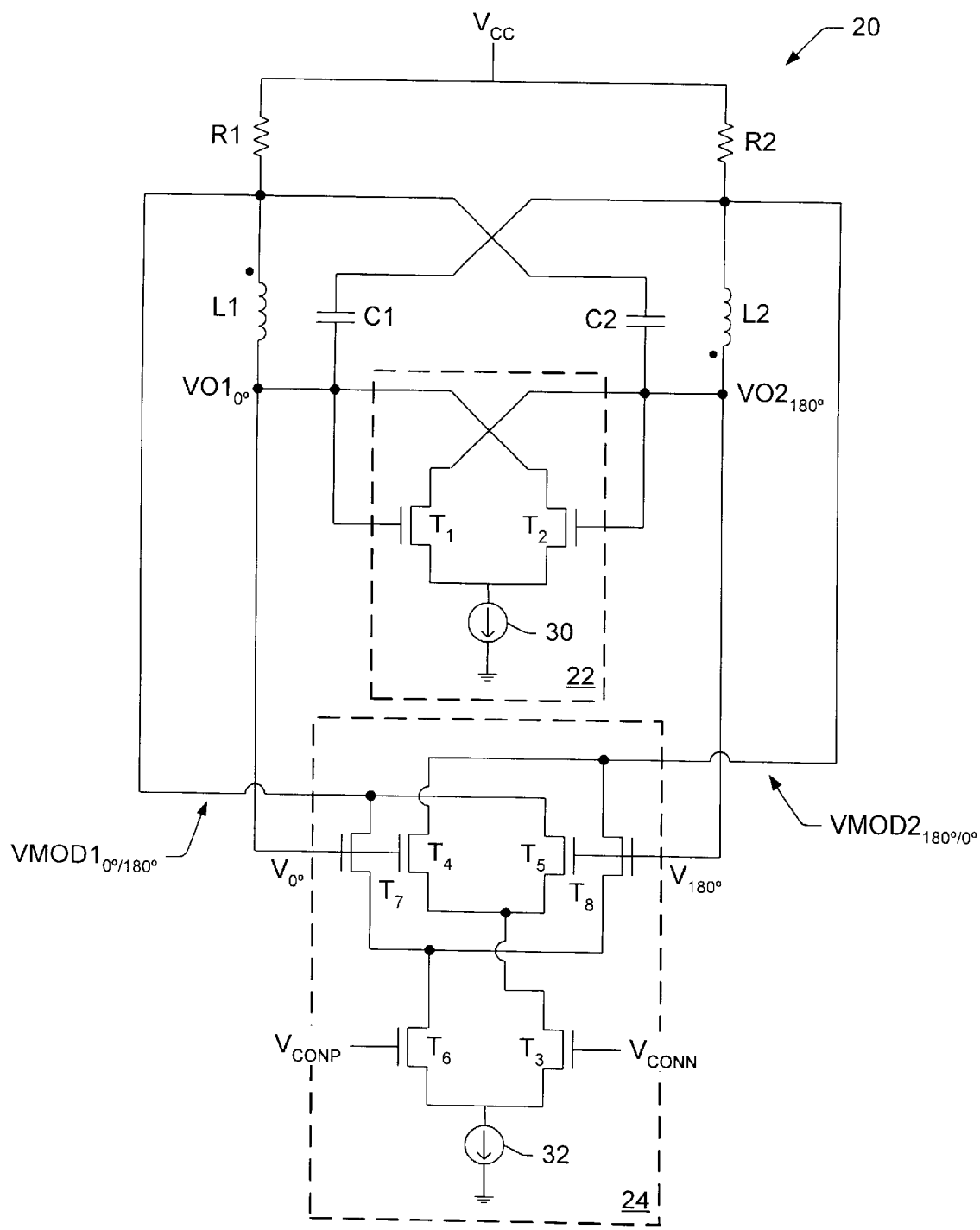
FIG. 5 is a circuit diagram of FIG. 3, showing amplitude modulation (or "selection") of the in-phase voltage, and the effect of that selection upon the voltage across the inductor (and capacitor) of the LC tank circuit.

FIG. 5 illustrates further details of circuit 20 and, in particular, amplifier 22 and modulator 24, according to one embodiment. Amplifier 22 can be a pair of cross-coupled transistors $T_1$ and $T_2$. Modulator 24 can be transistor $T_3$ connected to a pair of transistors $T_4$ and $T_5$, and transistor $T_6$ is connected to a pair of transistors $T_7$ and $T_8$.

The gain of transistors $T_1$ and $T_2$ ensure that the output voltage of the oscillator VO1 and V02 is amplified. Transistors $T_3$ and $T_6$ operate in differential mode to ensure whichever of the two control signals $V_{COMP}$ or $V_{CONN}$ is higher in voltage value, the corresponding transistor will predominate and the other transistor will not. For example, if $V_{COMP}$ is greater than $V_{CONN}$, then transistor $T_6$ will be on, causing transistors $T_7$ and $T_8$ to have a higher transconductance, whereas transistors $T_4$ and $T_5$ will turn on less than transistors $T_7$ and $T_8$ and therefore have a lower transconductance. Since transistor $T_7$ output is greater than the output of transistor $T_5$, the output voltage across R1 coupled to the left-hand inductor and right hand capacitor C2 will cause VMOD1 voltage value to be at 180°, similar to the inverse of input voltage $V_{0°}$. The modulating voltage VMOD1 will then be placed upon a terminal of inductor L1 and capacitor C2. Likewise, transistor $T_8$ will be activated by the input voltage $V_{180°}$. This will cause VMOD2 to be at 0°, and VMOD2 will be placed on a terminal of conductor L2 and capacitor C1. Thus, inductors L1 and L2, and capacitors C1 and C2, receive a voltage of the opposite phase as VO1 and V02 (i.e., VMOD1 is at 180° corresponding to $VO1_{0°}$, and VMOD2 is at 0°, the same as $VO2_{180°}$. If $V_{CONN}$ is greater than $V_{COMP}$, then the opposite of what is described above will occur. The relative voltages of $V_{COMP}$ and $V_{CONN}$ to each other will therefore regulate the output frequency of oscillator 20.

The function of capacitors C1 and C2 as well as inductors L1 and L2 of FIG. 5 is similar to that shown in FIG. 4. An increase in the phase angle differences between VMOD and VO will cause an increase in current within the LC tank circuit and a corresponding increase in frequency, whereas a decrease in phase difference between VMOD and VO will cause a decrease in current and a corresponding decrease in oscillator frequency output. Thus, while VMOD is selectable as being at the same phase angle or 180° phase angle offset from the output voltage of the oscillator, the modulating voltage is nonetheless said to be "in-phase" with the oscillation output voltage.

Resistors R1 and R2 serve to develop the modulation voltage resulting from the current from the modulator in series with the LC tank circuit. Whatever current flows through inductors L1 and L2 must also flow through resistors R1 and R2. Preferably, the resistance value of resistors R1 and R2 are equal and much smaller compared to the reactance of the capacitors and inductors of the frequency of oscillation. The resistor values of R1 and R1 are approximately 2–3 ohms. Also by way of example, the reactance of capacitors C1 and C2, which are matched, is approximately 50 ohms, and the reactance of inductors L1 and L2 can be approximately 50 ohms at the unmodulated frequency of oscillation. Inductors L1 and L2 can be set somewhere near 4 nanohenries at approximately 2 GHz, and capacitors C1 and C2 may have a capacitive value of approximately ⅓ picofarad to be resonant with the inductor at 2 GHz. The above numbers are merely examples of values which can be attributed to the various components and are not intended to limit all possible values for these passive components needed to meet the design criteria of a particular application.

Transistors $T_1$–$T_8$ can be MOS transistors, bipolar transistors or any three-terminal gain element, depending on the application design. Items 30 and 32 are shown as current sources. It is recognized that current sources can be formed in many different ways, all readily known to those skilled in the art.

The modulator will produce a continuously variable voltage across the resistors R1 and R2 from some negative (180° phase) maximum voltage to some maximum positive (0° phase) voltage depending on the input voltage $V_{COMP}$ and $V_{CONN}$. This will cause the frequency to be less than to more than the free-running frequency (where the reactance of the inductors are equal to the reactance of the capacitors). The modulation voltage across R1 is always equal in magnitude and opposite in sign to the voltage developed across R2 due to the modulation current.

Figure 6:
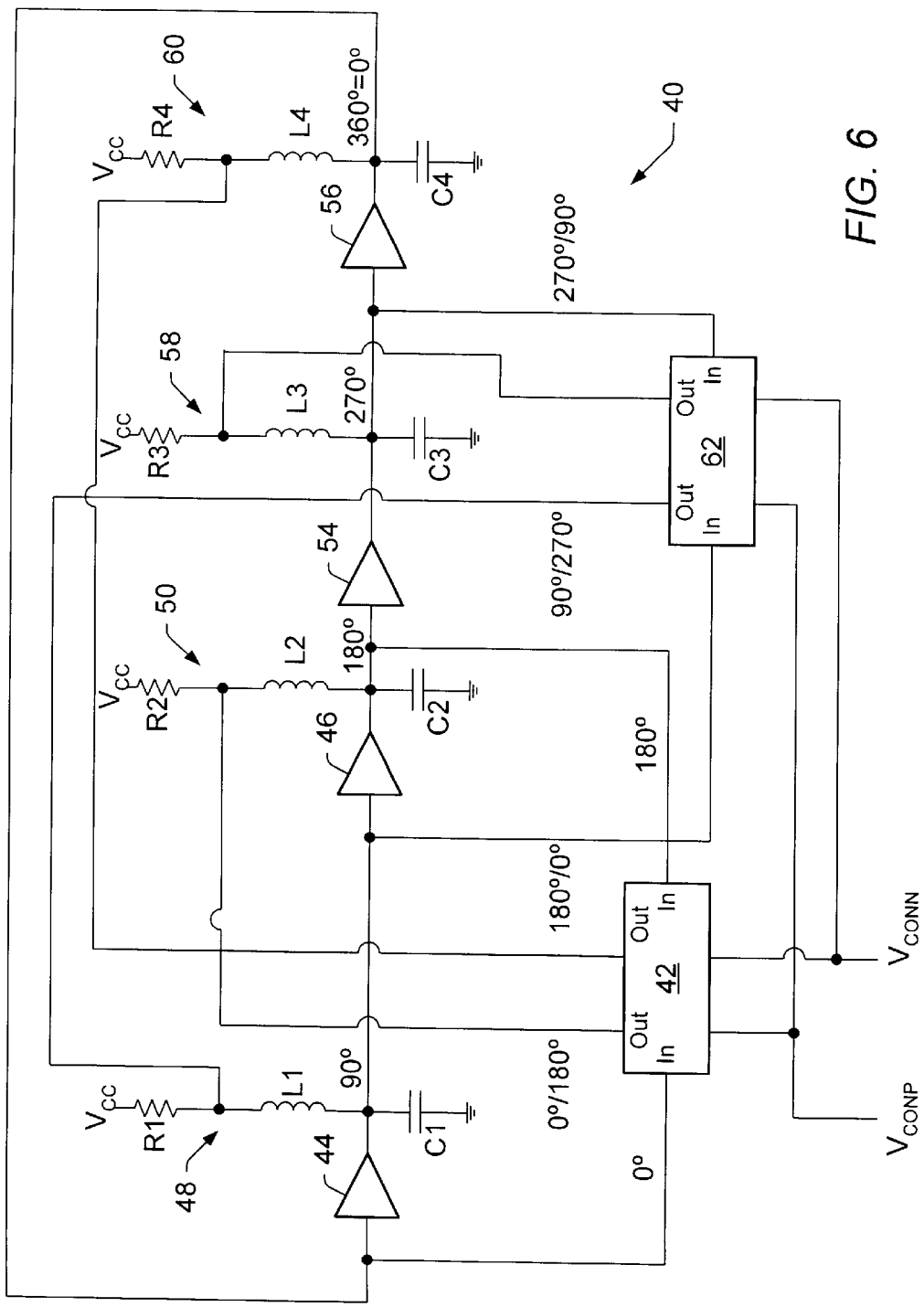
FIG. 6 is a block diagram of an oscillator with four stages in series, with feedback, to form a multi-phase (four phase) oscillator, where the modulation voltage is shown in series with the inductor only, but a connection similar to FIG. 5 could also be used where a modulation voltage is also in series with the capacitor, or only in series with the capacitor.

Using an in-phase modulating voltage rather than a quadrature voltage or quadrature current for modulating an oscillator is easier to manufacture simply because a quadrature signal does not have to be derived. FIG. 6 illustrates an even number of phases needed to derive an oscillation network 40. Although four phases are shown, two phases are identical in that a 180° phase shift occurs at the shared node and is equivalent to the circuit of FIG. 5.

A portion of network 40 to which modulator 42 is connected is identical to circuit 20 of FIG. 5. In other words, modulator 42 derives its input from the input of one amplifier stage and from the output of another amplifier stage, shown as amplifiers 44 and 46. The LC tank circuits 48 and 50 receive the modulating voltages placed in series with the inductor, according to one embodiment, in series with the capacitor according to another embodiment, or both in yet another embodiment. In the embodiment shown, modulating voltages are placed in series with inductors L1 and L2. Depending on the phase angle and the amplitude of the modulating voltage output from modulator 42, the oscillating output frequency of LC tank circuits 48 and 50 can change. In order to complete the network, another phase and a duplicative circuit, similar to circuit 20 of FIG. 5, can be inserted in series with amplifiers 44 and 46. That duplicative circuit is shown as amplifiers 54 and 56, LC tank circuits 58 and 60, and modulator 62. Similar to tank circuits 48 and 50, tanks circuits 58 and 60 have identical L, C, and R components. The output from tank circuit 60 is fed to the input of amplifier 44 to complete the oscillation network 40.

It is recognized that the modulator can provide modulating voltages on the capacitor, the inductor, or both the capacitor and inductor of the corresponding LC tank circuit. For example, FIG. 5 illustrates the modulation of both the inductor and capacitor by placing the modulating voltage on inductor L1 and capacitor C2, as well as inductor L2 and capacitor C1, as shown in FIG. 5. FIG. 6 illustrates a different arrangement for the LC tank circuit, where the modulating voltage is placed in series with respective inductors. In the LC tank circuit embodiment of FIG. 6, only the inductor is modulated with a voltage. If desired, the positions of the corresponding inductors and capacitors in FIG. 6 can be reversed, so that the modulating voltage modulates a capacitor, rather than an inductor. Therefore, the modulating voltage can modulate a capacitor only, an inductor only, or both a capacitor and an inductor. In instances where both the capacitor and inductor are modulated, the oscillation frequency can change in a more linear fashion than simply modulating only a capacitor or only an inductor. The following equation helps illustrate how modulation of both the inductor and capacitor will change the oscillation frequency f of an oscillator:

$$f = f_0 \frac{\sqrt{V_0 - V_{ML}}}{\sqrt{V_0 - V_{MC}}}$$

Where $V_0$ equals the output voltage, $V_{ML}$ equals the modulated voltage across an inductor, $V_{MC}$ equals the modulation voltage across a capacitor, and $f_0$ equals $\frac{1}{2\pi\sqrt{LC}}$.

If the modulation voltage superimposed on the capacitor, $V_{MC}$ is positive (i.e., is at a 0° phase angle relative to the output voltage $V_0$), then the denominator will decrease and, therefore, the oscillation frequency f increases. If the modulation voltage superimposed on the inductor $V_{ML}$ is negative (i.e., 180° phase angle relative to the output voltage $V_0$), then the numerator increases and the oscillation frequency f increases. If both of the above described modulation signals are applied, then the resultant change in frequency will be approximately double the increase in frequency, as compared to, if only one of the modulation signals is applied. The frequency will shift in the opposite direction if the $V_{MC}$ is negative and the $V_{ML}$ is positive.

It would be appreciated by those skilled in the art having the benefit of this disclosure that the embodiments described are believed applicable to the design of an oscillator whose output frequency is modulated by an in-phase modulating voltage. The phase relativity of the in-phase modulating voltage and the oscillating voltage, as well as the amplitude of the in-phase modulating voltage determines the amount by which the oscillator output frequency can controllably vary. Furthermore, although the exemplar embodiments presented herein comprise two phases or four phases, it should be understood that the principles disclosed herein are applicable to other numbers of phases. For example, six phases can be used to generate a 60°, 120°, 180°, 240°, 300° and 360° phase angles. Accordingly, the specification and drawings are to be regarded in an illustrative rather than a restrictive sense as to possibly numerous architectures, circuitry, and methodologies which fall within the spirit and scope of the present invention.

What is claimed is:

1. A circuit, comprising:
   an oscillator having a capacitor;
   a modulator adapted to change a resonant frequency of the oscillator by selectively coupling a modulating voltage upon the oscillator that is in-phase with a voltage placed upon the capacitor; and
   wherein said oscillator further comprises an inductor, and wherein the voltage placed upon the capacitor is also placed on a first terminal of the inductor, and wherein said modulating voltage is placed in series with the inductor on a second terminal of the inductor opposite the first terminal.

2. The circuit as recited in claim 1, wherein said modulating voltage is at substantially 0° or 180° phase relationship with the voltage across the capacitor.

3. The circuit as recited in claim 2, wherein said modulating voltage is at 0° phase relationship with the voltage across the capacitor during a first time in which the modulator receives a signal to increase the frequency of the oscillator.

4. The circuit as recited in claim 2, wherein said modulating voltage is at 180° phase relationship with the voltage across the capacitor during a second time in which the modulator receives a signal to decrease the frequency of the oscillator.

5. The circuit as recited in claim 1, wherein said modulating voltage is placed in series with said capacitor on a terminal of the capacitor opposite that on which the voltage is placed upon the capacitor.

6. The circuit as recited in claim 5, wherein during a first time in which said modulating voltage is at a 0° phase relationship with the voltage placed upon the capacitor to reduce the amount of voltage across the capacitor and thereby increase the frequency of the oscillator.

7. The circuit as recited in claim 5, wherein during a second time in which said modulating voltage is at a 180° phase relationship with the voltage placed upon the capacitor to increase the amount of voltage across the capacitor and thereby decrease the frequency of the oscillator.

8. The circuit as recited in claim 1, wherein during a first time in which said modulating voltage is at a 0° phase relationship with the voltage placed upon the first terminal of the inductor to reduce the amount of voltage across the inductor and thereby decrease the frequency of the oscillator.

9. The circuit as recited in claim 1, wherein during a second time in which said modulating voltage is at a 180° phase relationship with the voltage placed upon the first terminal of the inductor to increase the amount of voltage across the inductor and thereby increase the frequency of the oscillator.

10. The circuit as recited in claim 1, wherein said modulator is adapted to produce the modulating voltage having an amplitude that changes in proportion to changes in a control signal forwarded to the modulator, and wherein the frequency of oscillation of the oscillator changes substantially in proportion to changes in the amplitude.

11. A multi-phase oscillation network, comprising:
    a plurality of oscillator stages coupled in series, wherein each oscillator stage has a phase relationship that is substantially 180° out of phase from another oscillation stage;
    a plurality of modulators adapted to change the frequency of the oscillator by coupling a modulating voltage upon each of the plurality of oscillator stages that is in-phase with a voltage placed on an inductor and/or capacitor attributed to each oscillator stage; and
    a conductor coupled between an output of the series-connected plurality of oscillator stages and an input of the series-connected plurality of oscillator stages.

12. The multi-phase oscillation network as recited in claim 11, wherein the plurality of oscillator stages comprise:
    a first stage and a second stage coupled in series;
    a third stage and a fourth stage connected in series with the first and second stages.

13. The multi-phase oscillation network as recited in claim 12, wherein the plurality of modulators comprise:

a first modulator adapted to change the frequency of the first and second stages by coupling a first modulating voltage upon the first and second stages that is in-phase with a voltage placed on an inductor and/or capacitor attributed to each of the first and second stages; and a second modulator adapted to change the frequency of the third and fourth stages by coupling a second modulating voltage upon the third and fourth stages that is in-phase with a voltage placed on an inductor and/or capacitor attributed to each of the second and third stages.

14. The multi-phase oscillation network as recited in claim 11, wherein the modulating voltage is at 0° or 180° phase relationship with the voltage across the inductor and/or capacitor attributed to at least one oscillator stage to decrease or increase the frequency of the oscillation within the plurality of oscillator stages.

15. The multi-phase oscillation network as recited in claim 11, wherein the modulating voltage is placed in series with at lest one capacitor attributed to the plurality of oscillator stages on a terminal of said capacitor opposite that on which the voltage is placed upon said capacitor.

16. The multi-phase oscillation network as recited in claim 11, wherein the modulating voltage is placed in series with at least one inductor attributed to the plurality of oscillator stages on a terminal of said inductor opposite that on which the voltage is placed upon said inductor.

17. A method for controlling a resonant frequency, comprising:

changing a control signal voltage value to cause a corresponding change in the amplitude and/or sign of a modulating voltage;

inserting the modulating voltage in series with an inductor and/or capacitor of an oscillator to change the frequency of the oscillator dependent on the amount of change in the amplitude and/or sign of the modulating voltage; and wherein said changing comprises decreasing the control signal voltage value relative to another voltage value to cause the phase of the modulating voltage to be 180° from a voltage placed upon the inductor and/or capacitor to increase the frequency of the oscillator.

\* \* \* \* \*

UNITED STATES PATENT AND TRADEMARK OFFICE
CERTIFICATE OF CORRECTION

PATENT NO. : 6,667,668 B1
DATED : December 23, 2003
INVENTOR(S) : Henrion

It is certified that error appears in the above-identified patent and that said Letters Patent is hereby corrected as shown below:

<u>Title page</u>,
Item [74], *Attorney, Agent, or Firm*, please delete "Kevin J. Daffer" and substitute therefor -- Kevin  L. Daffer--.

<u>Column 9</u>,
Line 20, please delete "at lest" and substitute therefor -- at least --.

Signed and Sealed this

First Day of June, 2004

JON W. DUDAS
*Acting Director of the United States Patent and Trademark Office*